US009231551B2

United States Patent
Tai et al.

(10) Patent No.: US 9,231,551 B2
(45) Date of Patent: Jan. 5, 2016

(54) COMMON MODE FILTER WITH MULTI-SPIRAL LAYER STRUCTURE AND METHOD OF MANUFACTURING THE SAME

(71) Applicant: INPAQ TECHNOLOGY CO., LTD., Miaoli (TW)

(72) Inventors: Shin Min Tai, Taoyuan County (TW); Chien Heng Chen, Kaohsiung (TW); Wei Chuan Chen, Taoyuan County (TW); Yu Chia Chang, Taichung (TW)

(73) Assignee: INPAQ TECHNOLOGY CO., LTD., Miaoli (TW)

( * ) Notice: Subject to any disclaimer, the term of this patent is extended or adjusted under 35 U.S.C. 154(b) by 167 days.

(21) Appl. No.: 13/940,501

(22) Filed: Jul. 12, 2013

(65) Prior Publication Data

US 2015/0015344 A1    Jan. 15, 2015

(51) Int. Cl.
*H03H 7/01* (2006.01)
*H03H 7/42* (2006.01)
*H03H 1/00* (2006.01)

(52) U.S. Cl.
CPC ....... *H03H 7/427* (2013.01); *H03H 2001/0085* (2013.01)

(58) Field of Classification Search
CPC .................. H03H 7/427; H03H 2001/0085
USPC .......................... 333/12, 181, 185; 336/200
See application file for complete search history.

(56) References Cited

U.S. PATENT DOCUMENTS

2010/0033286 A1*  2/2010  Katayama et al. ............ 336/200
2013/0234819 A1*  9/2013  Yoo et al. ..................... 336/200

* cited by examiner

*Primary Examiner* — Benny Lee
*Assistant Examiner* — Rakesh Patel
(74) *Attorney, Agent, or Firm* — WPAT, P.C.; Anthony King

(57) ABSTRACT

A common mode filter with a multi-spiral layer structure includes a first coil, a first insulating layer, a second coil, a second insulating layer, a third coil, a third insulating layer, and a fourth coil, wherein the first coil serially connects with the fourth coil, and the second coil serially connects with the third coil. A first conductive pillar is configured to connect the first coil and the fourth coil, and a second conductive pillar is configured to connect the second coil and the third coil, wherein the first conductive pillar and the second conductive pillar are internally diagonally disposed relatively within a corner or the same side of corners of the rectangular spiral.

7 Claims, 8 Drawing Sheets

COMMON MODE FILTER WITH MULTI-SPIRAL LAYER STRUCTURE AND METHOD OF MANUFACTURING THE SAME

FIELD OF THE INVENTION

The present invention relates to a common mode filter, and more particularly relates to a multi-layer common mode filter and a method of manufacturing the same, which reduces oscillating impedance during varies frequency and applies to the high-speed differential transmission signal of USB 3.0, IEEE 1394, LVDS, DVI, HDMI, and MIPI.

DISCUSSION OF THE BACKGROUND

Common mode noise describes the type of noise that is conducted on all lines in the same direction. To suppress common mode noise, common mode filters or chokes can be installed on conducting lines where common mode noise is present. Traditionally, a common mode filter is comprised of components including an iron core and two coils wound around the iron core with the same winding number. When a common mode current flows through the common mode filter, the two coils generate a magnetic flux in the same direction such that the common mode filter exhibits high impedance and can suppress common mode noise.

Currently, various types of common mode filters apply to low frequency bands. As the market gradually increases and becomes mature, traditional common mode filters will no longer be satisfactory for matching the frequency range of frequency band applications. As the trend of electronic products is geared toward being lighter, thinner, shorter, and smaller, the development of common mode filters that operate in high frequency has also become necessary. In response to the demand for portable electronic products, chip-type common mode filters have been developed.

However, the impedance of conventional common mode filters may oscillate greatly when operating in various frequencies. The conventional common mode filters have less efficiency to suppress common mode noise and may not apply to the high-speed differential transmission signal of USB 3.0, IEEE 1394, LVDS, DVI, HDMI, and MIPI.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

The present invention discloses a multi-layer common mode filter, which reduces the oscillating impedance during varies frequency and applies to the high-speed differential transmission signal of USB 3.0, IEEE 1394, LVDS, DVI, HDMI, and MIPI.

In one embodiment of the present invention, a common mode filter with a multi-spiral layer structure includes a first coil; a second coil disposed on the first coil; a third coil disposed on the second coil, wherein the third coil connects in series with the second coil; and a fourth coil disposed on the third coil, wherein the fourth coil connects in series with the first coil.

In another embodiment of the present invention, a common mode filter with a multi-spiral layer structure includes a first coil, a second coil disposed on the first coil; a third coil disposed on the second coil; a fourth coil disposed on the third coil, wherein the first coil, the second coil, the third coil, and the fourth coil are in the form of a rectangular spiral; a first conductive pillar disposed inside the rectangular spiral and connecting the first coil and the fourth coil together; and a second conductive pillar disposed inside the rectangular spiral and connecting the second coil and the third coil together, wherein the first conductive pillar and the second conductive pillar are disposed relatively within a corner or the same side of corners of the rectangular spiral.

The present invention utilizes two pairs of coupling coils in series and the configuration of the conductive pillars to correct the oscillating impedance, which applies to the high-speed differential transmission signal of USB 3.0, IEEE 1394, LVDS, DVI, HDMI, and MIPI.

The foregoing has broadly outlined the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

Figure 1:
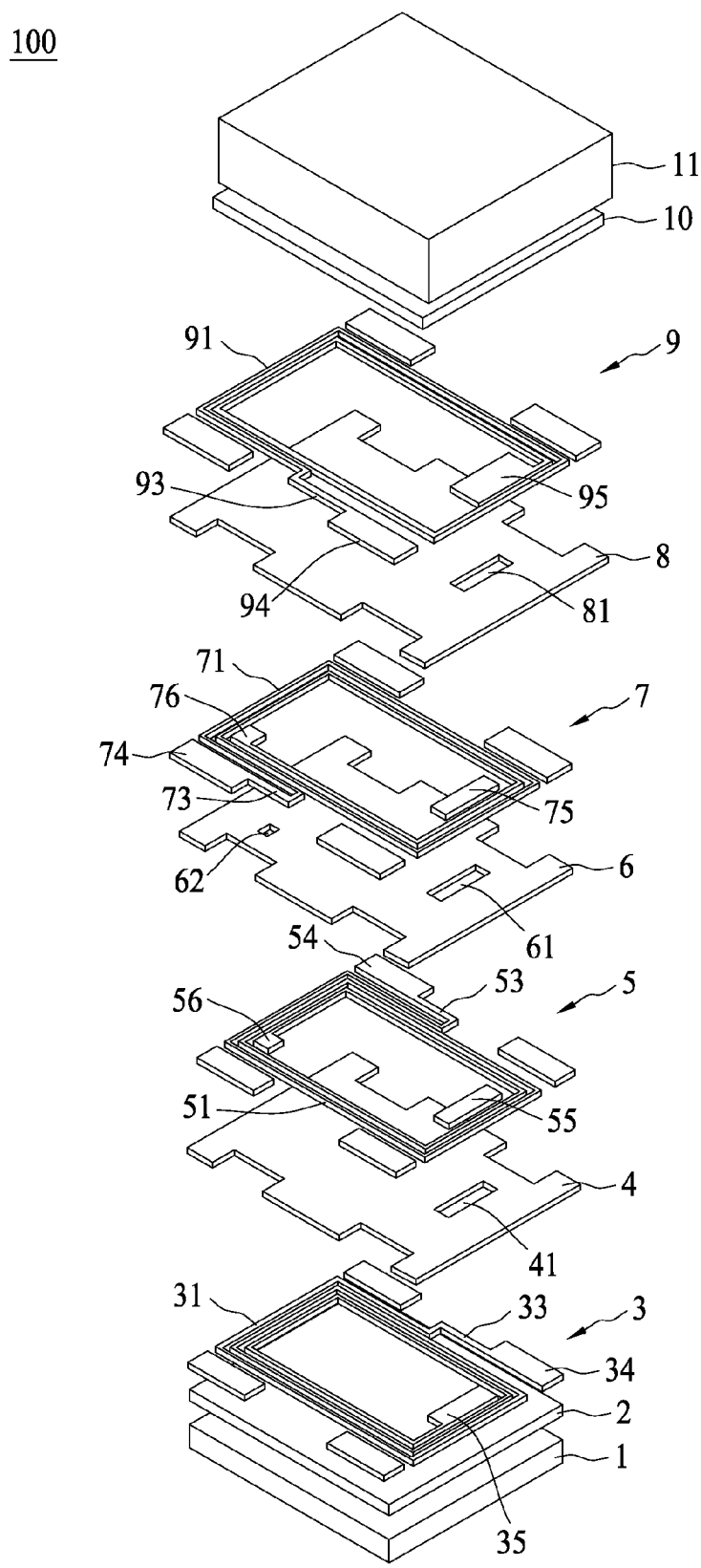
FIG. 1 is an exploded view schematically depicting a common mode filter according to one embodiment of the present invention.
Figure 2:
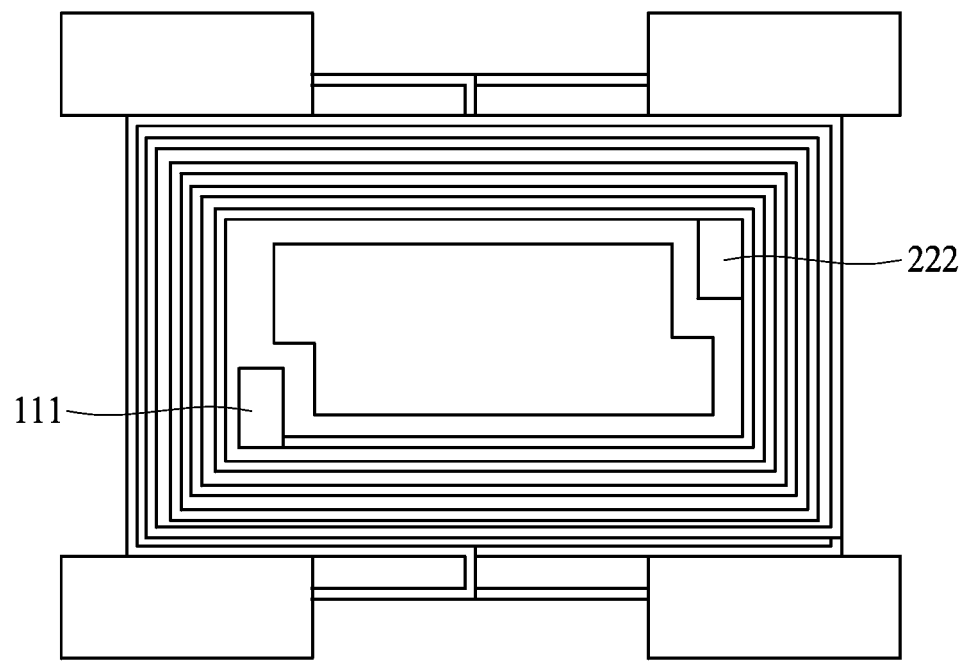
FIG. 2 is an overlook view of the common mode filter according to one embodiment of the present invention.
Figure 3:
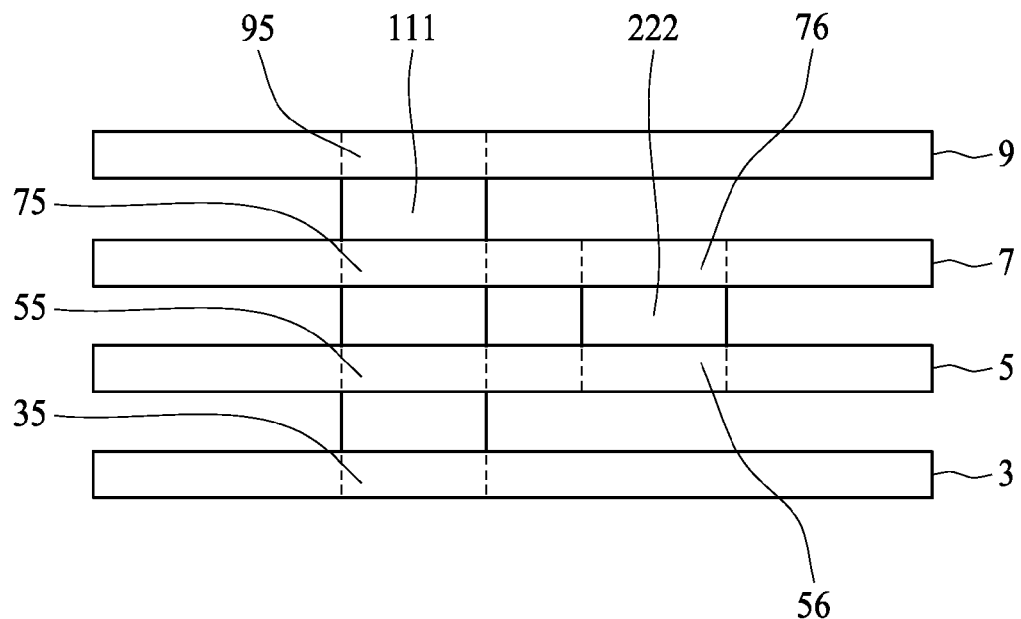
FIG. 3 is a lateral view of the common mode filter according to another embodiment of the present invention.

FIG. 1 is an exploded view schematically depicting a common mode filter 100 according to one embodiment of the present invention. FIG. 2 is an overlook view of FIG. 1 schematically depicting the common mode filter 100. FIG. 3 is a lateral view of FIG. 1 schematically depicting the common mode filter 100. As shown in FIG. 1, the common mode filter 100 includes a first material layer 1, a first lateral insulating layer 2, a first coil layer 3, a first insulating layer 4, a second coil layer 5, a second insulating layer 6, a third coil layer 7, a third insulating layer 8, a fourth coil layer 9, a second lateral insulating layer 10, and a second material layer 11, wherein the first insulating layer 4 electrically separates the first coil layer 3 from the second coil layer 5, the second insulating layer 6 electrically separates the second coil layer 5 from the third coil layer 7, and the third insulating layer 8 electrically separates the third coil layer 7 from the fourth coil layer 9.

The first coil layer 3 may include a first coil 31. The second coil layer 5 may include a second coil 51. The third coil layer 7 may include a third coil 71. The fourth coil layer 9 may include a fourth coil 91. The second coil 51 is disposed between the first coil 31 and the third coil 71. The third coil 71 is disposed between the second coil 51 and the fourth coil 91. The first coil 31 is connected in series with the fourth coil 91. The second coil 51 is connected in series with the third coil 71. The serially connected first and fourth coils 31 and 91 are magnetically coupled with the serially connected second and third coils 51 and 71 such that the serially connected first and fourth coils 31 and 91 and the serially connected second and third coils 51 and 71 may be used together to eliminate common mode noise.

In one embodiment, the first coil 31, the second coil 51, the third coil 71, and the fourth coil 91 may be in the form of a rectangular spiral as shown in FIG. 1. Alternatively, they may have other spiral shapes such as the shape of a circular spiral. In one embodiment, the first coil 31, the second coil 51, the third coil 71, and the fourth coil 91 may be overlapped in most portions along a vertical direction. In one embodiment, the first coil 31, the second coil 51, the third coil 71, and the fourth coil 91 may have the same number of coil windings.

Referring to FIG. 1, the first insulating layer 4 includes a contact hole 41, the second insulating layer 6 includes a contact hole 61, and the third insulating layer 8 includes a contact hole 81, wherein the contact hole 41, the contact hole 61, and the contact hole 81 may be overlapped in most portions along a vertical direction. The first coil 31 includes an inner end portion 35, and the fourth coil 91 includes an inner end portion 95.

The contact hole 41 is formed between the inner end portion 35 of the first coil 31 and a part of a conductive pillar 55 of the second coil layer 5, wherein the part of the conductive pillar 55 and the second coil layer 5 are not electrically connected. The contact hole 61 is formed between the part of the conductive pillar 55 of the second coil layer 5 and a part of the conductive pillar 75 of the third coil layer 7, wherein the part of the conductive pillar 75 and the third coil layer 7 are not electrically connected. The contact hole 81 is formed between the part of the conductive pillar 75 of the third coil layer 7 and an inner end portion 95 of the fourth coil 91. Therefore, the inner end portion 35 of the first coil 31 and the inner end portion 95 of the fourth coil 91 are electrically connected through the part of the conductive pillar 55 and the part of the conductive pillar 75 so as to electrically connect the first coil 31 and the fourth coil 91 in series. The electrical connection of the inner end portion 35 of the first coil 31, the part of the conductive pillar 55 of the second coil layer 5, the part of the conductive pillar 75 of the third coil layer 7, and the inner end portion 95 of the fourth coil 91 forms a first conductive pillar 111 of the common mode filter 100 shown in FIG. 2 and FIG. 3.

Furthermore, referring to FIG. 1, the second coil 51 includes an inner end portion 56, and the third coil 71 includes an inner end portion 76. The second insulating layer 6 includes a contact hole 62. The contact hole 62 is formed between the inner end portion 56 of the second coil 51 and the inner end portion 76 of the third coil 71, wherein the inner end portion 56 of the second coil 51 and the inner end portion 76 of the third coil 71 are electrically connected through the contact hole 62 so as to electrically connect the second coil 51 and the third coil 71 in series. The electrical connection of the inner end portion 56 of the second coil 51 and the inner end portion 76 of the third coil 71 forms a second conductive pillar 222 of the common mode filter 100 shown in FIG. 2 and FIG. 3.

Referring to FIG. 1, the first conductive pillar 111 of the common mode filter 100 penetrates through the contact hole 41, the contact hole 61, and the contact hole 81 to connect the inner end portion 35 of the first coil 31 and the inner end portion 95 of the fourth coil 91 in series. The second conductive pillar 222 of the common mode filter 100 penetrates through the contact hole 62 to connect the inner end portion 56 of the second coil 51 and the inner end portion 76 of the third coil 71 in series. The first coil 31, the second coil 51, the third coil 71, and the fourth coil 91 may be in the form of a rectangular spiral. The first conductive pillar 111 and the second conductive pillar 222 are disposed relatively within a corner of the rectangular spiral shown in FIG. 2.

Referring to FIG. 3, the first conductive pillar 111 is longer than the second conductive pillar 222. The first conductive pillar 111 penetrates through the first insulating layer 4, the second insulating layer 6, and the third insulating layer 8 to connect the first coil 31 of the first coil layer 3 and the fourth coil 91 of the fourth coil layer 9 in series, wherein the first conductive pillar 111 is not electrically connected with the second coil layer 5 or the third coil layer 7. The second conductive pillar 222 penetrates through the second insulating layer 6 to connect the second coil 51 of the second coil layer 5 and the third coil 71 of the third coil layer 7 in series.

Referring to FIG. 1 again, the first coil 31, the second coil 51, the third coil 71, and the fourth coil 91 each comprise an outer end portion (33, 53, 73, or 93) connecting to a corresponding electrode 34, 54, 74, or 94 disposed adjacent to the periphery of the common mode filter 100. The first coil 31, the second coil 51, the third coil 71, or the fourth coil 91 makes an external connection through the respective electrode 34, 54, 74, or 94.

Figure 4:
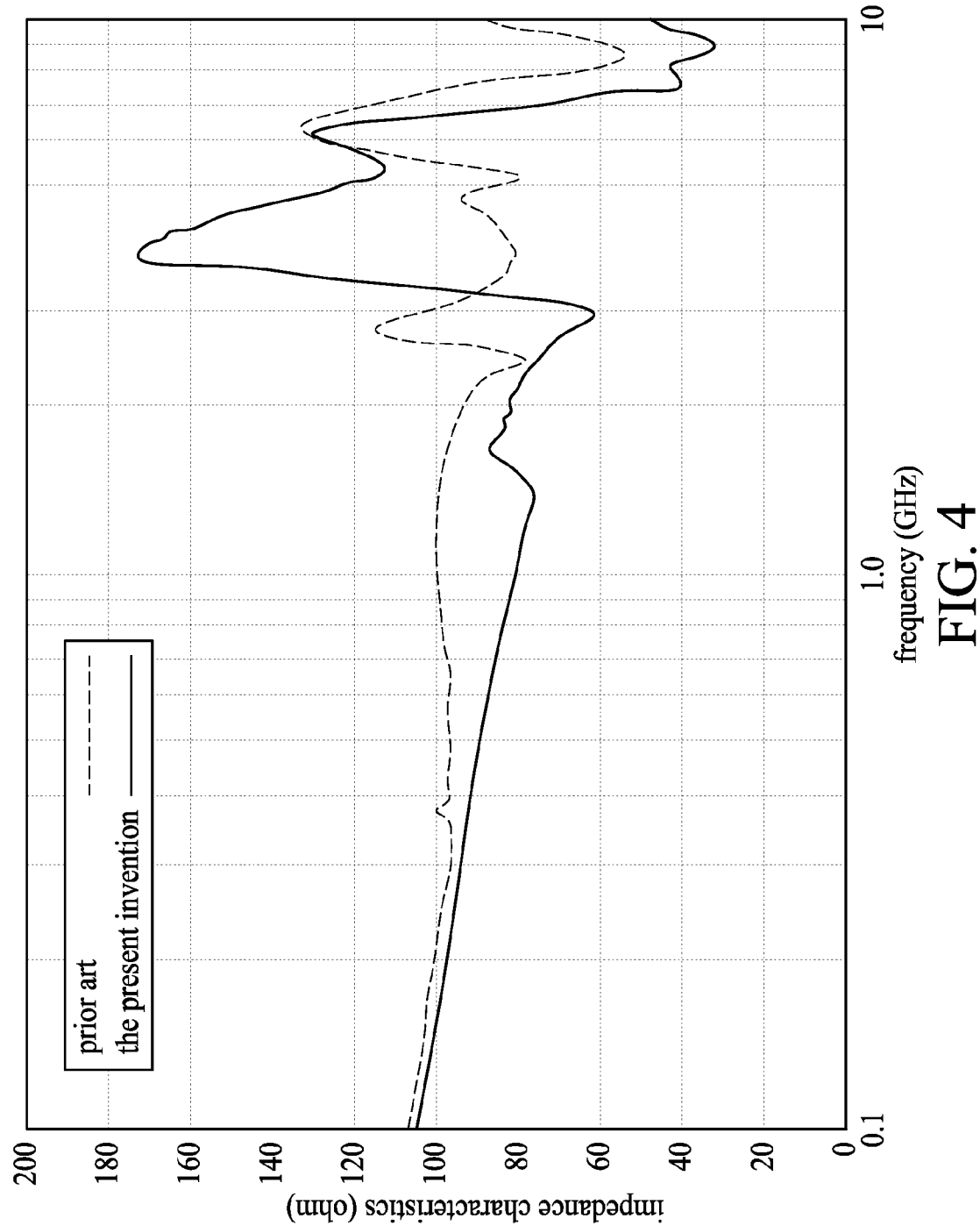
FIG. 4 is an electrical diagram of frequency impedance characteristics according to another embodiment of the present invention.

Referring to FIG. 4 showing an electrical diagram of frequency impedance characteristics, the horizontal axis is frequency and the longitudinal axis is impedance. In prior arts of common mode filters, when operating in various frequencies, its impedance characteristics may oscillate greatly. Also the prior arts are less effective when eliminating common mode noise and may not match the standard of international communications. Conversely, the impedance characteristics of the common mode filter 100 of the present invention may oscillate in a smaller manner, which applies to the high-speed differential transmission signals of USB 3.0, IEEE 1394, LVDS, DVI, HDMI, and MIPI. For example, according to USB 3.0, the impedance characteristics shall be in the range of 90±15Ω. The common mode filter 100 of the present invention thus matches the standard of USB 3.0, whereas prior arts may not match such standard.

Figure 5:
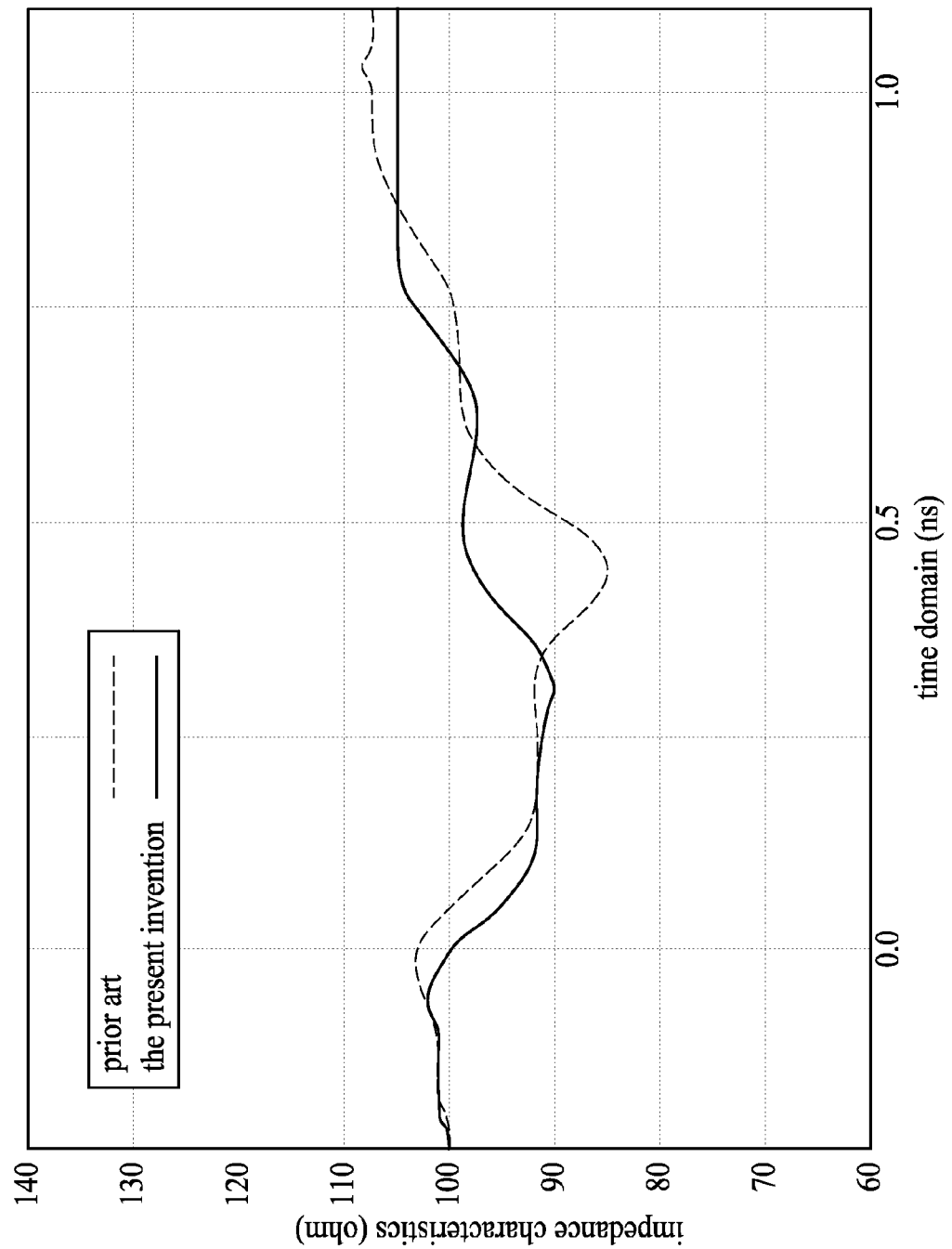
FIG. 5 is an electrical diagram of time domain impedance characteristics according to another embodiment of the present invention.

Referring to FIG. 5 showing an electrical diagram of time domain impedance characteristics in view of FIG. 4, the horizontal axis is time domain and the longitudinal axis is impedance. In prior arts of common mode filters, when operating in different frequency, its impedance characteristics may oscillate greatly. Also the prior arts are less effective when eliminating common mode noise. Conversely, the impedance characteristics of the common mode filter 100 of the present invention may oscillate in a smaller manner In summary, the common mode filter 100 of the present invention utilizes two pairs of coupling coils in series and the configuration of the conductive pillars to correct the oscillating impedance.

Figure 6:
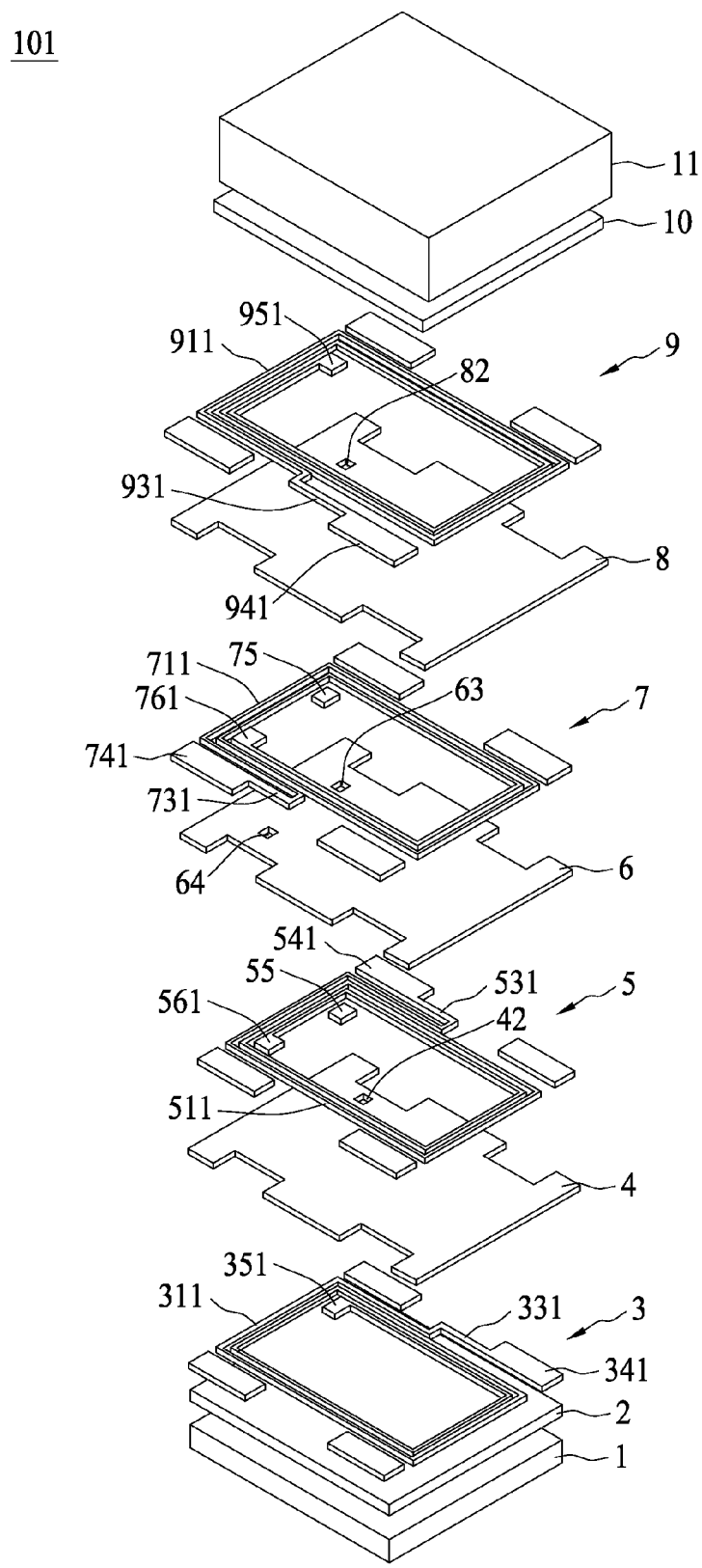
FIG. 6 is an exploded view schematically depicting a common mode filter according to another embodiment of the present invention.
Figure 7:
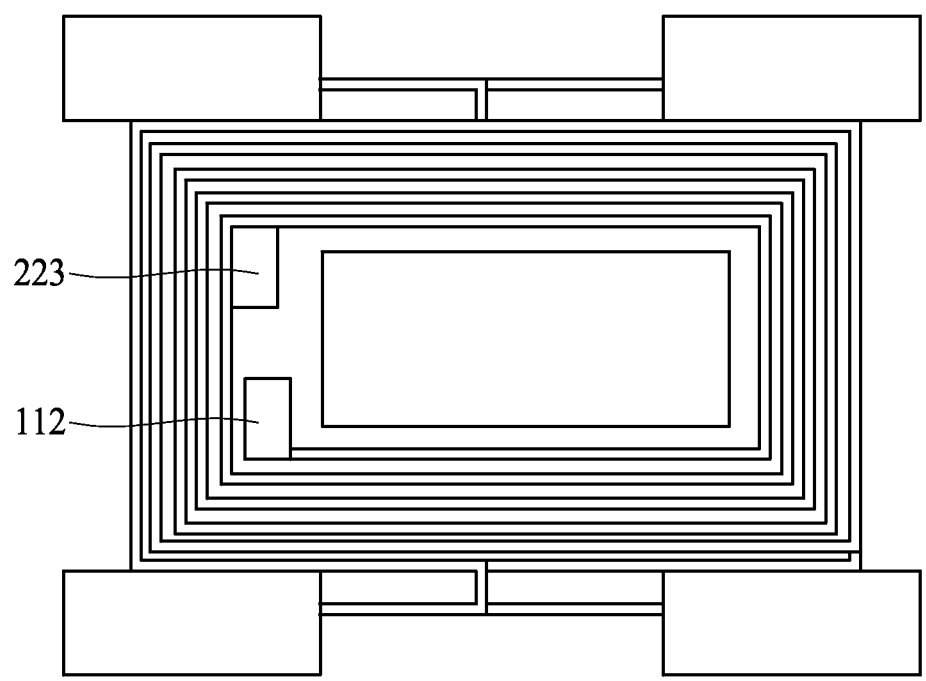
FIG. 7 is an overlook view of the common mode filter according to one embodiment of the present invention.

FIG. 6 depicts an exploded view of a common mode filter 101 according to another embodiment of the present invention. FIG. 7 is an overlooking view of the common mode filter 101 in view of FIG. 6. Comparing to the first conductive pillar 111 and the second conductive pillar 222 of the common mode filter 100, which are disposed relatively within a corner of the rectangular spiral, a first conductive pillar 112 and a second conductive pillar 223 of the common mode filter 101 are disposed on the same side of corners of the rectangular spiral shown in FIG. 6. A first coil 311 includes an inner end portion 351, and a fourth coil 91 includes an inner end portion 951. A first insulating layer 4 includes a contact hole 42. A second coil layer 5 includes a part of a conductive pillar 55. A third coil layer 7 includes a part of a conductive pillar 75. The third insulating layer 8 includes a contact hole 82. The contact hole 42 is formed between the inner end portion 351 of the first coil 311 and the part of the conductive pillar 55 of the second coil layer 5, wherein the part of the conductive pillar 55 and the second coil 511 are not electrically connected. The contact hole 63 is formed between the part of the conductive pillar 55 of the second coil layer 5 and the part of the conductive pillar 75 of the third coil layer 7, wherein the part of the conductive pillar 75 and the third coil 711 are not electrically connected. The contact hole 82 is formed between the part of the conductive pillar 75 of the third coil layer 7 and the inner end portion 951 of the fourth coil 911.

The contact hole 42, the contact hole 63, and the contact hole 82 may be overlapped in most portions along a vertical direction. Therefore, the inner end portion 351 of the first coil 311 and the inner end portion 951 of the fourth coil 911 are electrically connected through the part of the conductive pillar 55 and the part of the conductive pillar 75 so as to electrically connect the first coil 311 and the fourth coil 911 in series. The electrical connection of the inner end portion 351 of the first coil 311, the part of the conductive pillar 55 of the second coil layer 5, the part of the conductive pillar 75 of the third coil layer 7, and the inner end portion 951 of the fourth coil 911 forms a first conductive pillar 112 of the common mode filter 101.

The common mode filter 101 includes a second conductive pillar 223. The second coil 511 includes an inner end portion 561, and the third coil 711 includes an inner end portion 761. The second insulating layer 6 includes a contact hole 64. The contact hole 64 is formed between the inner end portion 561 of the second coil 511 and the inner end portion 761 of the third coil 711. The inner end portion 561 of the second coil 511 and the inner end portion 761 of the third coil 711 are electrically connected through the contact hole 64 so as to electrically connect the second coil 511 and the third coil 711 in series. The electrical connection of the inner end portion 561 of the second coil 511 and the inner end portion 761 of the third coil 711 forms the second conductive pillar 223 of the common mode filter 101.

The first conductive pillar 112 of the common mode filter 101 penetrates through the contact hole 42, the contact hole 63, and the contact hole 82 to connect the inner end portion 351 of the first coil 311 and the inner end portion 951 of the fourth coil 911 in series. The second conductive pillar 223 of the common mode filter 101 penetrates through the contact hole 64 to connect the inner end portion 561 of the second coil 511 and the inner end portion 761 of the third coil 711 in series.

In one embodiment, the first coil 311, the second coil 511, the third coil 711, and the fourth coil 911 may be in the form of a rectangular spiral. The first conductive pillar 112 connects the first coil 311 and the fourth coil 911 together and forms inside the rectangular spiral. The second conductive pillar 223 connects the second coil 511 and the third coil 711 together and forms inside the rectangular spiral. The first conductive pillar 112 and the second conductive pillar 223 are disposed on the same side of corners of the rectangular spiral.

In one embodiment, the first conductive pillar 112 and the second conductive pillar 223 are disposed on the same side of corners of the rectangular spiral so that such two conductive pillars are disposed separately in each corner of the rectangular spiral on the same side as shown in FIG. 7. The first conductive pillar 112 penetrates through the first insulating layer 4, the second insulating layer 6, and the third insulating layer 8 to connect the first coil 311 of the first coil layer 3 and the fourth coil 911 of the fourth coil layer 9 in series. The second conductive pillar 223 penetrates through the second insulating layer 6 to connect the second coil 511 of the second coil layer 5 and the third coil 711 of the third coil layer 7 in series. Thus, the first conductive pillar 112 is longer than the second conductive pillar 223, wherein the first conductive pillar 112 is not electrically connected with the second coil layer 5 and the third coil layer 7.

The first coil 311, the second coil 511, the third coil 711, and the fourth coil 911 each comprise an outer end portion (331, 531, 731, or 931) connecting to a corresponding electrode 341, 541, 741, or 941 disposed adjacent to the periphery of the common mode filter 101. The first coil 311, the second coil 511, the third coil 711, or the fourth coil 911 makes an external connection through the respective electrode 341, 541, 741, or 941.

Figure 8:
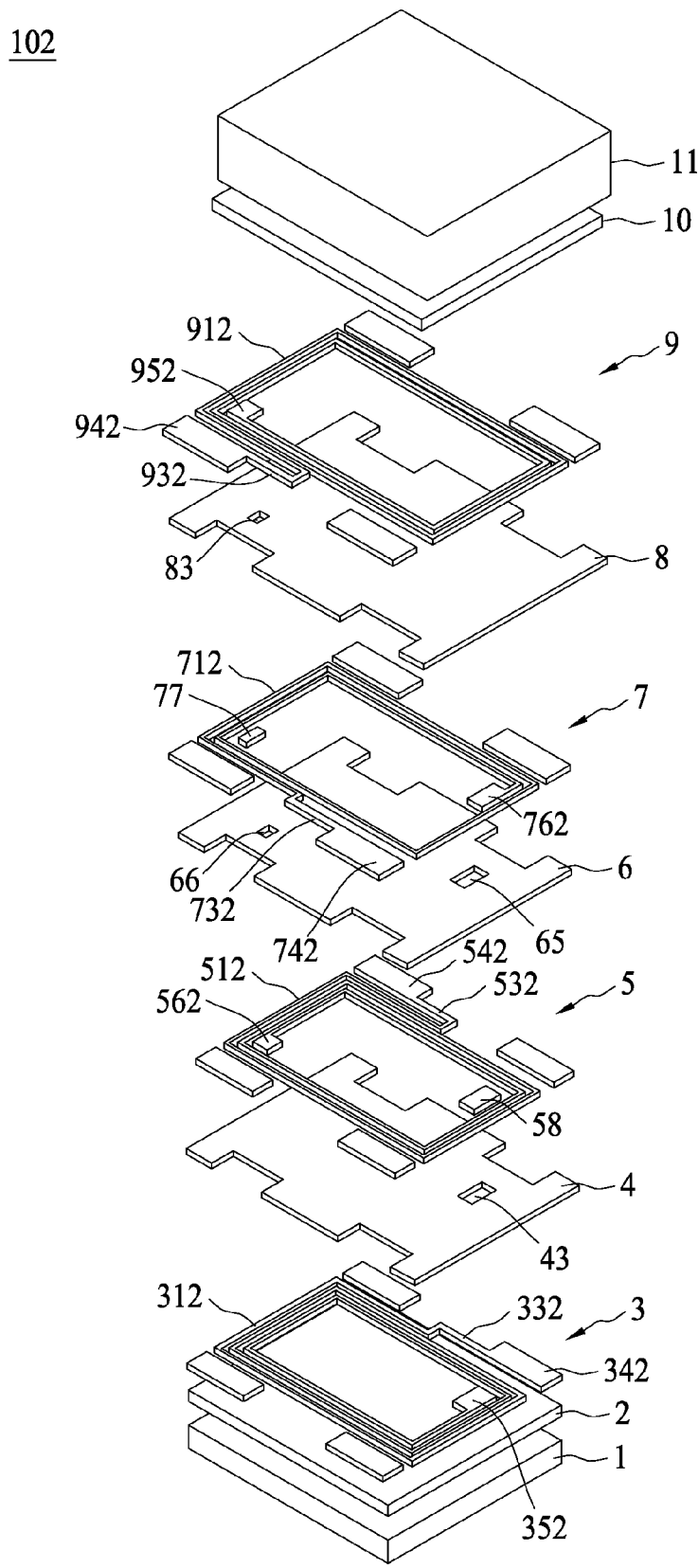
FIG. 8 is an exploded view schematically depicting a common mode filter according to another embodiment of the present invention.
Figure 9:
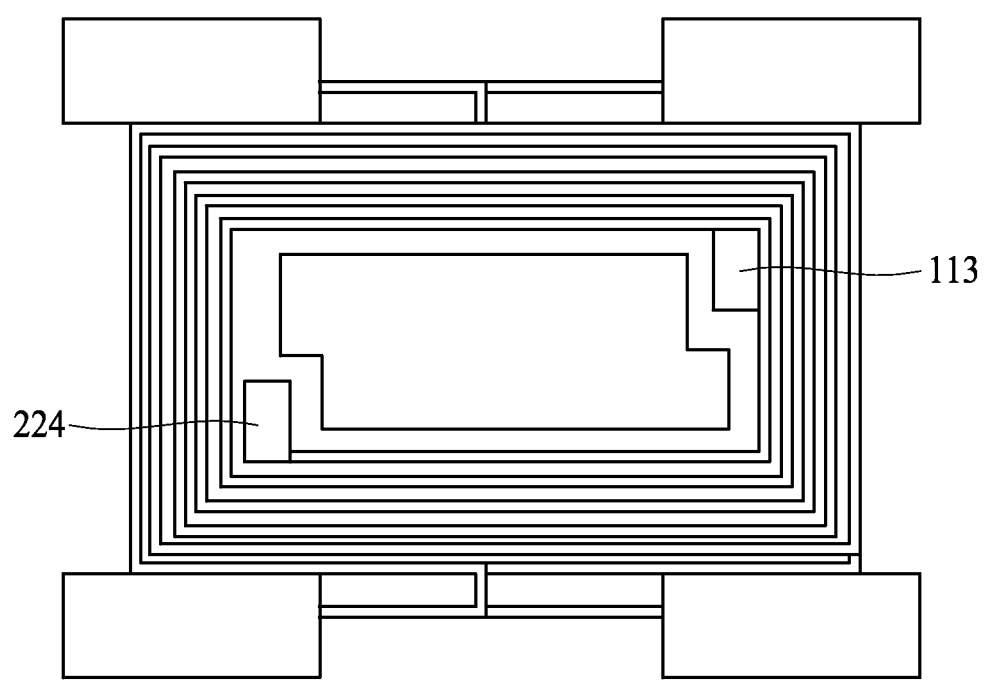
FIG. 9 is an overlook view of the common mode filter according to one embodiment of the present invention.

FIG. 8 depicts an exploded view of a common mode filter 102 according to another embodiment of the present invention. FIG. 9 is an overlooking view of the common mode filter 102 in view of FIG. 8. The former embodiments indicate the connection of the first coil 31 and the fourth coil 91 in series, and the connection of the second coil 51 and the third coil 71 in series. On the contrary, FIG. 8 indicates the connection of the first coil 312 and the third coil 712 in series, and the connection of the second coil 512 and the fourth coil 912 in series. A first conductive pillar 113 and a second conductive pillar 224 of the common mode filter 102 are disposed relatively within a corner of the rectangular spiral shown in FIG. 9. A first coil 312 includes an inner end portion 352. A first insulating layer 4 includes a contact hole 43. A second coil layer 5 includes a part of the conductive pillar 58. The second insulating layer 6 includes a contact hole 62. A third coil 712 includes an inner end portion 762. The contact hole 43 is formed between the inner end portion 352 of the first coil 312 and the part of the conductive pillar 58 of the second coil layer 5, wherein the part of the conductive pillar 58 and the second coil 512 are not electrically connected. The contact hole 65 is formed between the part of the conductive pillar 58 of the second coil layer 5 and the inner end portion 762 of the third coil layer 7. The contact hole 43 and the contact hole 65 may be overlapped in most portions along a vertical direction. The inner end portion 352 of the first coil 312 and the inner end portion 762 of the third coil 712 are electrically connected through the part of the conductive pillar 58 so as to electrically connect the first coil 312 and the third coil 712 in series. The electrical connection of the inner end portion 352 of the first coil 312, the part of the conductive pillar 58 of the second coil layer 5, and the inner end portion 762 of the third coil layer 7 form a first conductive pillar 113 of the common mode filter 102.

A second coil 512 includes an inner end portion 562. The second insulating layer 6 includes a contact hole 66. A third coil 712 includes a part of a conductive pillar 77. The third insulating layer 8 includes a contact hole 83. A fourth coil 912 includes an inner end portion 952. The contact hole 66 is formed between the inner end portion 562 of the second coil 512 and the part of a conductive pillar 77 of the third coil 712. The contact hole 83 is formed between the part of the conductive pillar 77 of the third coil 712 and the inner end portion 952 of the fourth coil 912, wherein the inner end portion 562 of the second coil 512 and the inner end portion 952 of the fourth coil 912 are electrically connected through the part of the conductive pillar 77 so as to electrically connect the second coil 512 and the fourth coil 912 in series. The contact hole 66 and the contact hole 83 may be overlapped in most portions along a vertical direction. The electrical connection of the inner end portion 562 of the second coil 512, the part of the conductive pillar 77, and the inner end portion 952 of the fourth coil 912 forms a second conductive pillar 224 of the common mode filter 102.

The common mode filter 102 includes the first conductive pillar 113 and the second conductive pillar 224. The first conductive pillar 113 of the common mode filter 102 penetrates through the contact hole 43 and the contact hole 65 to connect the inner end portion 352 of the first coil 312 and the inner end portion 762 of the third coil 712 in series. The second conductive pillar 224 penetrates through the contact hole 66 and the contact hole 83 to connect the inner end portion 562 of the second coil 512 and the inner end portion 952 of the fourth coil 912 in series.

In this embodiment as shown in FIG. 8, the first coil 312, the second coil 512, the third coil 712, and the fourth coil 912 may be in the form of a rectangular spiral. The first conductive pillar 113 connects the first coil 312 and the third coil 712 together and forms inside the rectangular spiral. The second conductive pillar 224 connects the second coil 512 and the fourth coil 912 together and forms inside the rectangular spiral. The first conductive pillar 113 and the second conductive pillar 224 are disposed relatively within a corner of the rectangular spiral.

In one embodiment, the first insulating layer 4, the second insulating layer 6, and the third insulating layer 8 may comprise of polyimide, epoxy, or benzocyclobutene (BCB). Of the first insulating layer 4, the second insulating layer 6 and the third insulating layer 8, at least one may comprise of magnetic material such as ferromagnetic material. In one embodiment, a magnetic material layer comprises of nickel zinc ferrite or manganese-zinc ferrite.

The process for forming the first insulating layer 4, the second insulating layer 6, and the third insulating layer 8 may be a spin-coating process, a dipping process, a spraying process, a screen-printing process, or a thin film process.

In one embodiment, the first coil layer 3, the second coil layer 5, the third coil layer 7, and the fourth coil layer 9 may be formed using a plating process or a vacuum film formation process including a vapor deposition process or a sputtering process. The first coil layer 3, the second coil layer 5, the third coil layer 7, and the fourth coil layer 9 may include silver, palladium, aluminum, chromium, nickel, titanium, gold, copper, platinum, or an alloy thereof.

In one embodiment, at least one of the first material layer 1 or the second material layer 11 may include magnetic material such as ferromagnetic material. Specifically, the first material layer 1 may be a magnetic material layer, while the second material layer 11 is a non-magnetic material layer or an insulating layer. Alternatively, the first material layer 1 may be a non-magnetic material layer or an insulating layer, while the second material layer 11 is a magnetic material layer. The inclusion of magnetic material in the first material layer 1 and/or the second material layer 11 can confine the magnetic field created by the common mode filter 100. As a result, the common mode filter 100 can provide a better filtering performance In one embodiment, the afore-mentioned magnetic material layer includes a magnetic plate. The afore-mentioned non-magnetic material layer includes a non-magnetic plate. The afore-mentioned insulating layer includes an insulating plate. In one embodiment, the magnetic material layer includes nickel zinc ferrite or manganese-zinc ferrite. In one embodiment, the non-magnetic material layer includes aluminum oxide, aluminum nitride, glass, or quartz. In one embodiment, the magnetic material layer includes polymer and magnetic powder. The polymer may include polyimide, epoxy, or benzocyclobutene. The magnetic powder may include nickel zinc ferrite or manganese-zinc ferrite.

In one embodiment, the first material layer 1 includes a heterogeneous substrate. In another embodiment, the second material layer 11 includes a heterogeneous substrate. The heterogeneous substrate includes an insulating substrate and a magnetic material layer. The insulating substrate and the magnetic material layer may be co-fired together such that the insulating substrate and the magnetic material layer are joined by diffusion bonding. In another embodiment, the insulating substrate 111 and the magnetic material layer can be bonded together by an adhesive. In yet another embodiment, the insulating substrate 111 and the magnetic material layer 112 can be separately formed using a thick film printing process.

In one embodiment, the first coil 31 can be formed by using a frame plating process. The plating process initially forms an electrode layer on the lateral insulating layer 2. The electrode layer can be formed by using a sputtering or vapor deposition process. A chromium or titanium film can be formed under the electrode layer for facilitating the adhesion between the electrode layer and the lateral insulating layer 2. Next, a photoresist layer with a coil pattern is formed on the electrode layer by a lithography process. Thereafter, an electroplated layer is formed using an electroplating process. The photoresist layer is peeled off, then the electrode layer is removed using an etch process, and finally, the first coil 31 can be obtained.

Furthermore, a first insulating layer 4 is formed, covering the first coil layer 3. The first insulating layer 4 may include polymer, which may comprise polyimide, epoxy, or benzocyclobutene. The first insulating layer 4 may be formed using a spin-coating process, a dipping process, a spraying process, a screen-printing process, or a thin film process. Next, the aforementioned process is repeated to form the first insulating layer 5, the second coil layer 5, the second insulating layer 6, the third coil layer 7, the third insulating layer 8, and the fourth coil layer 9.

The formation of contact holes, for example, is shown in FIG. 1. On the inner portion 35 of the first coil 31, an etching is used to form the contact hole 41, the contact hole 61, and the contact hole 81 so as to expose the inner portion 35 of the first coil 31. Next, metal is deposited inside the contact holes by a vacuum film formation process or plating so as to form the first conductive pillar 111. The contact hole 62 and the conductive pillar 222 can be formed by the same method. As shown in FIG. 6, the etching and depositing are used to form the contact hole 42, the contact hole 63, the contact hole 82, and the first conducting pillar 112. The same method is used to form the contact hole 64 and the second conducting pillar 223. As shown in FIG. 8, the etching and depositing are used to form the contact hole 43, the contact hole 65, and the first conducting pillar 113. The same method is used to form the contact hole 66, the contact hole 83, and the second conducting pillar 224. The conductive pillar may be made of silver, palladium, aluminum, chromium, nickel, titanium, gold, copper, platinum, or an alloy thereof.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A common mode filter with a multi-spiral layer structure, comprising:
   a first coil;
   a second coil disposed on the first coil;
   a third coil disposed on the second coil, wherein the third coil is directly connected in series with the second coil; and
   a fourth coil disposed on the third coil, wherein the fourth coil id directly connected in series with the first coil and not directly connected with the second coil or the third coil.

2. The common mode filter of claim 1, further comprising:
   a first insulating layer configured to separate the first coil from the second coil;
   a second insulating layer configured to separate the second coil from the third coil; and
   a third insulating layer configured to separate the third coil from the fourth coil.

3. The common mode filter of claim 2, further comprising:
   a first conductive pillar penetrating through the first insulating layer, the second insulating layer, and the third insulating layer to connect the first coil and the fourth coil together; and
   a second conductive pillar penetrating through the second insulating layer to connect the second coil and the third coil together.

4. The common mode filter of claim 3, wherein the first coil, the second coil, the third coil, and the fourth coil are in the form of a rectangular spiral, and the first conductive pillar and the second conductive pillar are disposed inside the rectangular spiral, wherein the first conductive pillar and the second conductive pillar are disposed relatively within a corner or the same side of corners of the rectangular spiral.

5. The common mode filter of claim 3, wherein an inner end portion of the first coil is connected with an inner end portion of the fourth coil through the first conductive pillar, and an inner end portion of the second coil is connected with an inner end portion of the third coil through the second conductive pillar.

6. A common mode filter with a multi-spiral layer structure, comprising:
   a first coil;
   a second coil disposed on the first coil;
   a third coil disposed on the second coil;
   a fourth coil disposed on the third coil, wherein the first coil, the second coil, the third coil, and the fourth coil are in the form of a rectangular spiral, wherein the fourth coil is directly connected in series with the first coil and not directly connected with the second coil or the third coil;
   a first conductive pillar disposed inside the rectangular spiral and connecting the first coil and the fourth coil together; and
   a second conductive pillar disposed inside the rectangular spiral and connecting the second coil and the third coil together, wherein the first conductive pillar and the second conductive pillar are disposed relatively within a corner or the same side of corners of the rectangular spiral.

7. The common mode filter of claim 6, wherein an inner end portion of the first coil is connected with an inner end portion of the fourth coil through the first conductive pillar, and an inner end portion of the second coil is connected with an inner end portion of the third coil through the second conductive pillar.

* * * * *